United States Patent
Namba et al.

(10) Patent No.: US 7,800,766 B2
(45) Date of Patent: Sep. 21, 2010

(54) METHOD AND APPARATUS FOR DETECTING AND ADJUSTING SUBSTRATE HEIGHT

(75) Inventors: Carol Osaka Namba, Walnut, CA (US); Po-Hsin Liu, Anaheim, CA (US); Ioulia Smorchkova, Lakewood, CA (US); Mike Wojtowicz, Long Beach, CA (US); Rob Coffie, Camarillo, CA (US)

(73) Assignee: Northrop Grumman Space & Mission Systems Corp., Los Angeles, CA (US)

( * ) Notice: Subject to any disclaimer, the term of this patent is extended or adjusted under 35 U.S.C. 154(b) by 518 days.

(21) Appl. No.: 11/859,501

(22) Filed: Sep. 21, 2007

(65) Prior Publication Data
US 2009/0078888 A1     Mar. 26, 2009

(51) Int. Cl.
*G01B 11/14* (2006.01)
*H01J 37/304* (2006.01)

(52) U.S. Cl. ............ 356/614; 356/620; 250/491.1

(58) Field of Classification Search ............ 356/609, 356/614, 620, 622, 399–401; 250/491.1, 250/492.2, 492.23, 548, 208.1; 438/14, 16
See application file for complete search history.

(56) References Cited

U.S. PATENT DOCUMENTS

| | | | |
|---|---|---|---|
| 3,652,863 A | 3/1972 | Gaskell et al. | |
| 3,799,679 A | 3/1974 | Simko et al. | |
| 3,804,521 A | 4/1974 | Sprague | |
| 5,011,960 A * | 4/1991 | Ando et al. | 356/608 |
| 5,072,128 A | 12/1991 | Hayano et al. | |
| 5,209,813 A * | 5/1993 | Oshida et al. | 216/59 |
| 5,528,047 A * | 6/1996 | Nakajima | 250/491.1 |
| 5,783,833 A * | 7/1998 | Sugaya et al. | 250/548 |
| 5,872,629 A | 2/1999 | Colvard | |
| 6,392,749 B1 | 5/2002 | Meeks et al. | |
| 6,538,740 B1 * | 3/2003 | Shiraishi et al. | 356/401 |
| 6,568,290 B1 | 5/2003 | Poris | |
| 6,624,430 B2 * | 9/2003 | Higuchi | 250/492.23 |
| 6,690,460 B2 | 2/2004 | Chiu et al. | |
| 6,768,556 B1 | 7/2004 | Matsumoto et al. | |
| 6,829,054 B2 | 12/2004 | Stanke et al. | |
| 7,119,351 B2 * | 10/2006 | Woelki | 250/559.4 |
| 2005/0258365 A1 | 11/2005 | Bloess et al. | |
| 2005/0264802 A1 | 12/2005 | Shibata et al. | |
| 2006/0077403 A1 | 4/2006 | Zaidi | |

* cited by examiner

*Primary Examiner*—Sang Nguyen
(74) *Attorney, Agent, or Firm*—LaRiviere, Grubman & Payne, LLP

(57) ABSTRACT

A method and apparatus 10 for detecting the height of non-flat and transparent substrates using one or more reflectors 30 patterned on the surface of the substrate 40 and adjusting the position of the substrate in its holder based on measurement of the height of the reflectors in comparison to a calibration marker 60 on the holder and using appropriate spacers 50 with appropriate thickness to adjust the placement of the substrate at various locations to place the greatest portion of the substrate in an optimal focal range of the lithography system.

11 Claims, 2 Drawing Sheets

METHOD AND APPARATUS FOR DETECTING AND ADJUSTING SUBSTRATE HEIGHT

TECHNICAL FIELD

The present invention relates to lithographic systems. More particularly, the present invention relates to a method and apparatus for determining the height of the surface of a substrate and adjusting the position of the substrate to be located in an optimal focal range. Even more particularly, the present invention relates to such a method and apparatus for detecting height of a non-flat transparent substrate using reflective material.

BACKGROUND

Semiconductor evolution continues to advance toward development of smaller arid smaller devices to provide faster operating transistors and higher density chips. However, this march toward smaller dimensions requires more sophisticated processes and equipment. For example, newer, yet mature, higher resolution and higher energy lithography techniques, such as E-Beam lithography, are being refined and developed to allow fabrication at the nanometer level rather than the micrometer level. As the lithography tools create finer and finer resolution for smaller dimension patterning, imperfection in a water substrate becomes a critical aspect of chip fabrication quality control. If the surface of a substrate is warped or wavy, the projected image from the lithography tools will become distorted and have out-of-specification image dimensions. Hence, systems are needed to more accurately detect wafer imperfections and to support modifications to accommodate those imperfections, thereby maintaining and improving production yields.

Lithography is a process used to create features on the surface of substrates. Such substrates can include those used in the manufacture of flat panel displays, circuit boards, integrated circuits and other semiconductor systems, including devices requiring submicron dimensions. A frequently used substrate for such applications is a semiconductor wafer. While this description is written in terms of a semiconductor wafer for illustrative purposes, one skilled in the art would recognize that this description also applies to other types of substrates and lithographic processes known to those skilled in the art.

Various lithography systems have differing types of exposure apparatus which may be used depending on the application. For example, x-ray, ion, electron or photon lithography each may require a different exposure apparatus, as is known to those skilled in the art.

In the lithography process, accurately determining the dimensions and surface topography of the target substrate is critical to maximizing resolution of the projected image. Accurate height measurement is essential to allow proper focus of the beam used to pattern sub-micron features. Two key factors affecting a user's ability to accurately measure substrate height are substrate transparency and substrate flatness.

With non-transparent substrates, and at coarser resolutions, height may be more easily measured because the light from a height measurement device, such as a red laser, is reflected from the surface of the non-transparent substrate back to the height detector sensor. Thus, to a limited degree, the height of the non-transparent substrate can be measured somewhat accurately, and, adjusted to be within an optimal focal range for pattern writing on the substrate by the lithography tool. Contrarily, this height detection method cannot be used for transparent substrate for two reasons. First, when used on a transparent substrate, the reflected laser signal needed for height detection is so small that it cannot be detected accurately by the sensor. Second, the substrate non-flatness must be leveled to the focus latitude of the lithography tool's capabilities.

Typically, an aluminum film is applied on top of resist on a transparent substrate used in E-Beam lithography to allow sufficient reflection to detect the substrate height. This method suffers from two deficiencies. First, depending on the thickness of the aluminum film, the laser beam may be partially transmitted through the aluminum film, the layer of resist, and finally into and through the transparent substrate. Consequently, a number of different reflective signals are produced which cannot be accurately interpreted by the height detection sensor to provide a true and accurate height measurement. Additionally, since aluminum film is coated on top of the resist, the actual height of the surface of the substrate is not being measured, the aluminum film will have differing heights, and hence, additional variations are introduced which reduce ability to obtain a measurement to place the substrate in the desired focal range.

Alternatively, a reflective film or metal, such as gold, may be deposited on the underside of a transparent wafer to provide reflection of a specific wavelength. Again, the accuracy of this method still hinges on the thickness of metal deposited on the underside of the wafer, the thickness of the wafer, and, the particular wavelength of the laser. These multiple variables coalesce to create inherent inaccuracies in height detection using this approach.

Further, certain broadband wavelengths can be used to enhance height detection measurement accuracy, but once again, there remains inherent variability in the measurement.

An apparatus and method is needed that will allow a non-flat and transparent wafer substrate to be positioned in a substrate holder such that the substrate is placed in an optimal focal range for the desired purpose. In particular, there is a need for such a method and apparatus to support next generation lithography tools to create smaller and smaller images on substrates, including transparent substrates.

DISCLOSURE OF INVENTION

A preferred embodiment of the invention comprises a method and apparatus for detecting the height and topography of non-flat and transparent substrates using one or more reflectors patterned on the surface of a substrate and adjusting the position of the substrate in its holder based on measurement of the height of the reflectors in comparison to a calibration reference marker on the holder to place the substrate in an optimal focal range of the lithography system.

The preferred embodiment of the invention is directed to improving focus accuracy in a lithography system. Reflective material, having a uniform, equal thickness, is deposited on the surface of a transparent substrate to reflect a light source emanating from a height measurement device, such as, for example, a red laser. The reflective material, hereinafter, a "reflector" or "reflectors," is deposited at various locations on the substrate. The number of reflectors and spacing of the reflectors is dependent on the size of the substrate and the degree of unflatness or non-flatness. Generally, the larger the substrate, the greater the number of reflectors deposited on the surface of the substrate to adequately map the substrate surface height based on a correlation with the height or top of the reflectors. The optimal number of reflectors can be determined via a trial and error process to develop a mapping of the surface of the substrate sufficient to allow placement of the substrate within an optimal focal range for the particular lithography tool. Although the reflective material is described herein as having a uniform, equal thickness, the method is operable where the thickness or height of the reflective material is known, even if not uniform and equal.

The reflective material used for a reflector includes any material reflective of the light or radiation source used for height detection, including metals such as titanium, platinum, nickel, gold, silver and combinations thereof. Depending on the substrate topography, reflective material thickness will range from 500 to 5000 Angstroms. In a preferred embodiment, each reflector will have an equivalent height. Additionally, each reflector will have a diameter from 5 micrometers to 3 millimeters. Generally, the minimum size of a reflector is no less than the areal extent of the projected image of the height detection light source impinged on the reflector. However, the reflector may be smaller than the projected image of the detector light source as long as a sufficient portion of the reflected light beam can be sensed by the height detector sensor.

Substrates can have various defects, particularly, non-flatness, such as bowing, and, non-uniform thickness, also known as topography variation. Consequently, the position of the substrate within its holder must be adjusted to be within an appropriate focal range for the specific lithography tool and purpose. A preferred embodiment of the invention provides one or more spacers used to adjust the height of the substrate within its holder based upon mapping the top of the individual reflectors created on the surface of the substrate.

To adjust the position of the substrate within its holder, one or more spacers are placed under the substrate holder clamps, depending on the non-flatness of the wafer. The thickness of each spacer will depend on the wafer non-uniformity and the clamp locations for the substrate holder of the lithography tool. Spacers can be made of any type material having sufficient integrity and resistance to compression to maintain the desired offset between the bottom of the holder clamp and the surface of the wafer substrate directly below the clamp. Depending on the topography of the wafer substrate, and, the desired optimal focal plane for the lithography tool, a spacer will typically range in thickness from 1 to 50 micrometers.

The method and apparatus of the present invention provides consistent and accurate measurement of the location of the substrate surface to enhance the lithography process allowing the generation of more precise output. Using the method of the present invention, the height of the transparent substrate can be detected reliably, consistently and repeatedly. When the substrate height can be accurately detected, the beam of the lithography tool can be focused as needed to support writing on transparent substrates, such as gallium nitride ("GaN") or sapphire substrates.

Additionally, the method allows the height of the substrate surface to be pre-mapped prior to patterning. Consequently, the optimal focal plane to maximize production from the wafer can be selected prior to patterning, increasing wafer throughput and production yields. Further, the method allows one to determine if any height adjustments are necessary prior to patterning to provide the most uniform focus across the wafer surface. Still further, this pre-mapping can provide information on the shape of the substrate to suggest qualitative assessment of expected material growth. Moreover, the pre-napping can allow patterning on non-transparent substrates by the determination of a mean height value. And also, performing the pre-mapping in combination with the use of spacers, the substrate can be adjusted to satisfy focal plane requirements. The method can be used for both transparent and non-transparent substrate material.

BRIEF DESCRIPTION OF DRAWINGS

For fuller understanding of the present invention, reference is made to the accompanying drawings numbered below. Commonly used reference numbers identify the same or equivalent parts of the claimed invention throughout the several figures.

BEST MODE FOR CARRYING OUT THE INVENTION

Lithography systems typically include an integral focus system used to ensure and confirm that the wafer substrate surface is positioned in the desired image plane, i.e., the "focal plane," of the projection system. However, the integral systems axe only able to work within a specific range, which may be insufficient given the desire to create smaller and more precise patterns on substrates. The invention delivers a method and apparatus for current and next generation systems to enhance ability to position a wafer in the optimal focal range of a lithography system. In particular, the invention supports the ability of E-Beam lithography systems having higher resolution to more accurately focus the projection system on the wafer surface.

Although described with reference to E-Beam lithography systems and height detection for transparent, non-flat substrates, one skilled in the art will recognize that the described preferred embodiment of the invention is equally adaptable to and complementary to enhancing focal capabilities of existing optical, excimer laser, x-ray, ion beam and other such lithography systems. Still further, the invention can provide enhanced focal capabilities for non-transparent substrates as well. Additionally, the invention may be adapted to enhance placement and positioning of substrates and other materials used in production of micro-electromechanical systems (MEMS), strain gauges, batteries, light-emitting diodes (LED's), optoelectronics, solar cells, temperature sensors, acoustic wave devices, micro-machines, flat panel displays and field emission devices (FEDs).

Figure 1:
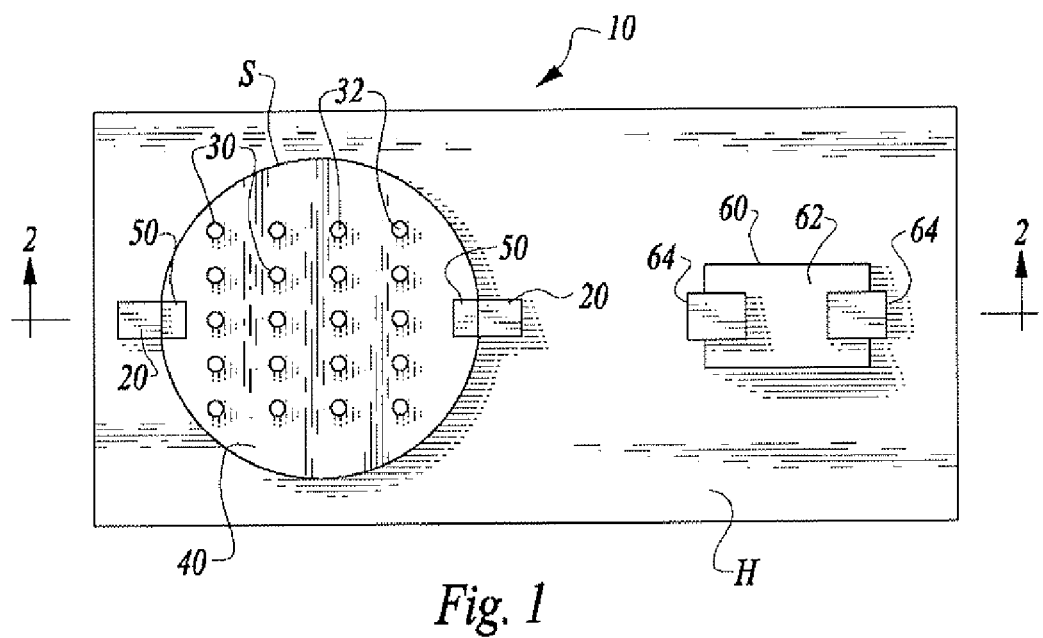
FIG. 1 is a plan view of the apparatus according to a preferred embodiment of the present invention.

FIG. 1 is a plan view of the apparatus 10 of a preferred embodiment of the present invention. The apparatus 10 includes a substrate holder plate H for holding a substrate S. A substrate holder clamp 20 secures the substrate S to the holder plate H. Reflective material 30, hereinafter, reflectors 30, is deposited on a surface 40 of the substrate S. Spacers 50 having varying thicknesses are sandwiched between the substrate holder clamps 20 and the substrate surface 40 to cause the substrate S to be positioned within a desired focal range R of an optimal focal plane P. The entire apparatus 10 is incorporated in a lithography system (not shown).

Figure 2:
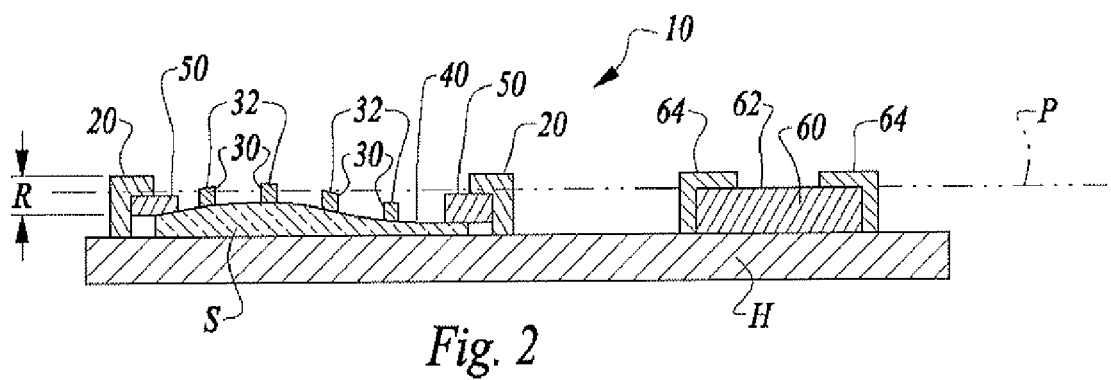
FIG. 2 is a cross-section view of the apparatus illustrated in FIG. 1 according to a preferred embodiment of the present invention; and, FIG. 3 is a flowchart describing the height detection and substrate adjustment method according to a preferred embodiment of the present invention.

Now, and in greater detail, with reference to FIGS. 1 and 2, the apparatus 10 can be adapted to accommodate substrate holder plates H well known to those skilled in the art. Further, although described herein as providing enhanced height detection and positioning for transparent, non-flat substrates S, the present invention may be used to enhance height detection and positioning for other types of substrates.

As shown in FIG. 1, one or more reflectors 30 are deposited on the surface 40 of the substrate S. The reflectors 30 are deposited on the surface of the substrate S using any suitable deposition technique including, among others, chemical vapor deposition, evaporation or sputtering, depending on the reflective material used. The reflectors 30 are made from a number of reflective materials including gold, titanium, platinum, nickel, silver, copper, tungsten, molybdenum, nichrome, combinations thereof, or any other material having sufficient reflectivity to reflect a light source used for determining surface height, such as a red laser or light emitting diode. Further, reflectors 30 have variable shapes, sizes and heights to accommodate individual wafer substrates S. However, for a particular wafer substrate, all reflectors will have the same height.

Reflectors 30 preferably range in height from 500 to 5000 Angstroms, adapting to the potential variation in the topography of a particular wafer substrate used in the lithography system. However, the reflectors 30 can vary from the stated range to accommodate wafer substrates with greater variation in thickness and uniformity. In a preferred embodiment of the invention, reflectors 30 have a preferred minimum height, i.e., thickness of 1000 Angstroms and a preferred maximum height, i.e., thickness of 1400 Angstroms. The minimum thickness prevents spurious reflections from the underlying substrate which would impede the ability to measure the top 32 of the reflectors 30, which is used to determine the actual height and/or position of the substrate surface 40.

The tops 32 of reflectors 30 have a minimum areal extent larger than the projected image of a light source beam such as a red laser used for detecting the top 32 of a reflector 30. In a preferred embodiment, as shown in FIGS. 1 and 2, the reflectors 30 have a cylindrical shape. Reflectors 30 have sizes ranging from 5 micrometers to 3 millimeters in diameter. Reflectors 30 may have other shapes so long as the width and length or diameter of the shape of the top 32 of the reflector 30 is sufficient to provide an areal extent on its top 32 to reflect the projected image of the light source used for height detection. For example, where the projected image of the light source is circular, a reflector 30 having a square shape whose top 32 has a width at least as great as the diameter of the projected image of the light source is sufficient. However, where the projected image of the light source is oblong, the top 32 of a reflector 30 would have a rectangular shape whose areal extent is sufficient to capture and reflect the oblong projected image of the light source.

As shown in FIG. 2, to adjust the position of the wafer substrate S in its holder, one or more spacers 50 are placed under the substrate holder clamps 20, depending on the topography of the wafer. The thickness of a spacer 50 depends on the wafer substrate S topography and the substrate holder clamp 20 locations for the substrate holder H of the lithography tool (not shown). Spacers 50 can be made of any type material sufficiently resistant to compression to maintain the desired offset when in use. Depending on the non-flatness of the wafer substrate, the desired focal plane P and focal range R, a spacer 50 ranges in thickness from 1 to 50 micrometers. In an additional embodiment, height adjustment means to adjust the position of the substrate S in the holder H is comprised of a screw adjustment mechanism (not shown) of the type used for raising or lowering a point by application of rotational movement. Still further, height adjustment means may include a combination of both spacers 50 and a screw adjustment mechanism.

As shown in FIG. 1, in a preferred embodiment of the invention, a reference calibration marker 60 is provided adjacent the wafer substrate S as a reference for determining a height differential between the desired focal plane P of the particular lithography tool and the actual positioning of the substrate S to determine if the substrate surface 40 is positioned within a desired focal range R. In the preferred embodiment, the calibration marker 60 is placed adjacent to the wafer substrate S and on the holder H. The calibration marker 60 may also be present on the surface of the wafer substrate S itself.

The desired focal range R is determined by the acceptable focal tolerances of the particular lithography tool being used, or, by the guidelines and specifications associated with the particular lithography process. For example, in the production of a monolithic microwave integrated circuit, i.e., a "MMIC," using E-Beam lithography, an acceptable tolerance for the focal range R is +/−25 micrometers off the focal plane P. For other lithography systems or processes, the acceptable focal range tolerance can be smaller. The apparatus of the invention can adapt to different lithography systems and processes having variable focal range tolerances.

FIG. 1 illustrates an application of the invention where the particular lithography tool has a substantially horizontal optimal focal plain P. The invention can also accommodate tools where the optimal focal plain is not perfectly horizontal. For example, in certain tools, the beam is deflected during writing operations, thereby creating a curved focal plain. A non-horizontal focal plane creates additional complexities associated with ensuring that the substrate surface 40 is within an optimum focal range R. The apparatus 10 of the present invention is intended to address these additional complexities to place the substrate surface 40 in an optimum focal range R for any type tool or process.

Figure 3:
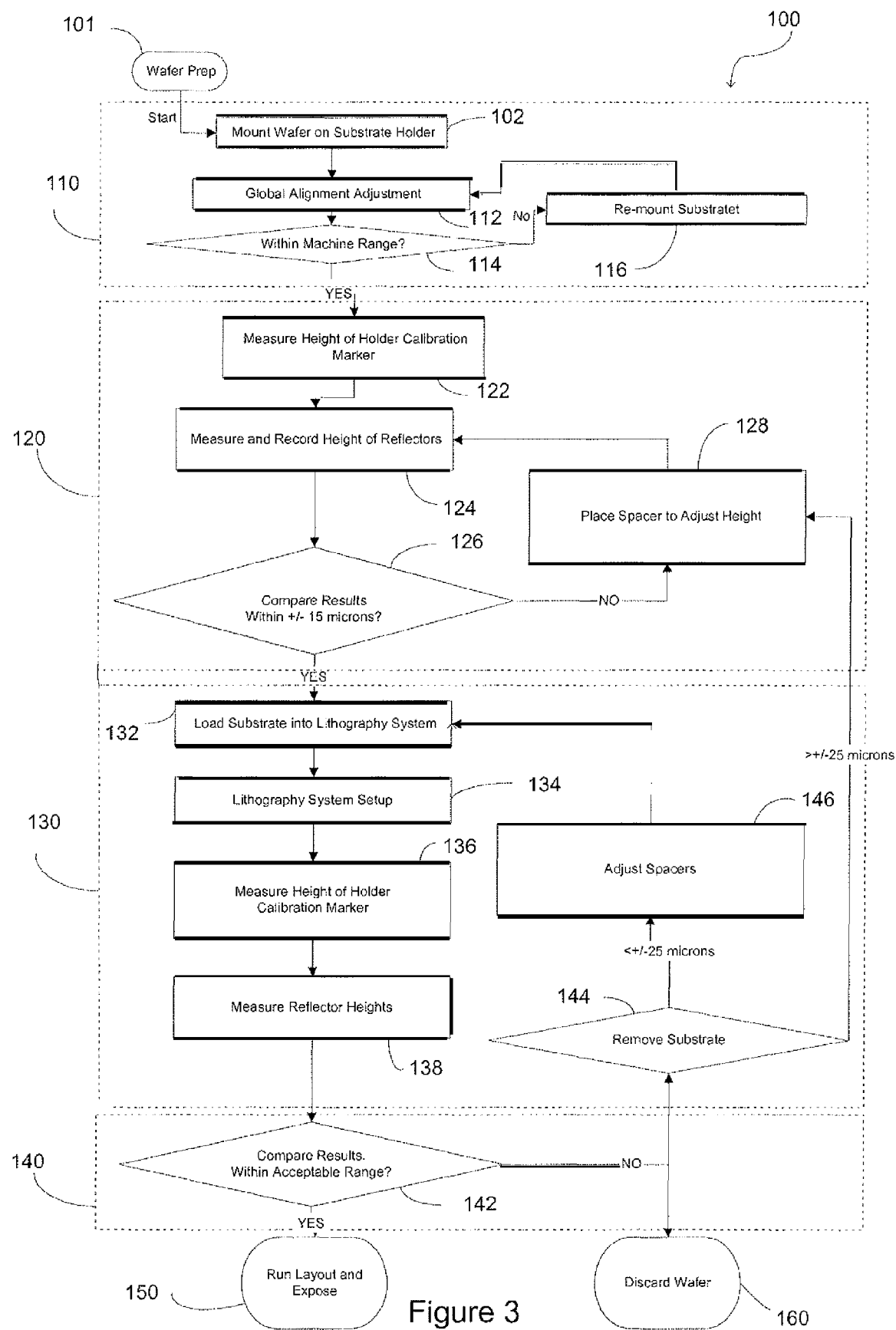

FIG. 3 is a flowchart illustrating the steps of the method 100 of the present invention for detecting the height and position of a wafer substrate S at various locations so as to position the substrate surface 40 in a substrate holder H within an optimal focal range R of the desired focal plane P in a lithography system.

Prior to aligning the substrate S, reflectors 30 are patterned on the surface 40 of the transparent substrate S according to the following steps: First, the substrate S is coated with an optical resist and exposed and developed using g-line or i-line optical lithography tools. The line size, alignment and resolution are optically checked under an optical light microscope. The wafer substrate S then undergoes de-scumming and wet clean prior to metal evaporation and deposition. Reflector material, such as gold, is then evaporated within an evaporator using a quartz crystal monitor to measure the film thickness during deposition on the surface of the substrate. It is a primary goal of this step to place a uniform thickness of reflective metal across the surface 40 of the substrate S from which the reflectors are created. The wafer substrate S is mounted in an evaporator on a ring which is rotated during the evaporation process to ensure uniform deposition of the reflective material. The reflector material thickness is measured at three or more sites on the substrate wafer S, typically, the top, center and bottom, to confirm uniformity. After evaporation and deposition of the reflective material onto the surface 40 of the substrate S, portions of the deposited film are then lifted off using a wet process to create one or more distributed reflectors 30 with tops 32, all of which have equivalent heights, i.e., thicknesses. After the reflector 30 creation step, the wafer substrate S is then re-inspected optically to confirm acceptable reflective material lift-off. The height of the top 32 of each reflector 30 is then recorded and charted onto a mapping chart and included in a mapping database. If the deposited reflective material is within acceptable specifications, the wafer substrate S is processed.

Now, in more detail, the method 100 of the invention according to FIG. 3 is described. A wafer substrate S is first adjusted for global alignment (110) within a holder H. The globally-aligned substrate S captured in a holder H is then roughly adjusted to be within a desired focal range R using spacers 50 (120). The substrate S and holder H are loaded into the lithography system (not shown) for finer height adjustments and measurement checks (130) using the internal focus system of the lithography tool. The lithography system may be one of any of E-Beam, x-ray, ion, electron, optical or photon.

For illustrative purposes herein, the method described is directed to an E-Beam lithography system. One example of such a system is the Leica 5000.

The rough adjustment step (120) continues until the substrate S is positioned within an acceptable focal range R. Consequently, the substrate holder H and substrate S may be repeatedly removed from the lithography system and further external rough adjustment repeated (140) until within the acceptable focal range R. Fine adjustment within the lithography system (130) and external rough readjustment (140) is repeated until the spacers 50 have been adjusted to place the surface 40 of the substrate S in an acceptable focal range R. Once the surface 40 of the substrate S has been placed in an acceptable focal range R, the substrate S is subjected to exposure radiation of the lithography system (150). If repeated attempts to place the surface 40 of the substrate S fail to place the surface 40 within an acceptable focal range tolerance R, the wafer is either re-surfaced, recycled or discarded (160).

Now, with further reference to FIG. 3 and in greater detail, the method 100 of the present invention is described. A wafer substrate S is readied for lithography exposure (101) wherein one or more reflectors are patterned on the surface 40 of the substrate S. The wafer substrate S is then mounted on a substrate holder H (102). The substrate S is then globally aligned to satisfy specifications of the particular lithography tool (110). The substrate S in the holder H is adjusted for global alignment (112). The global alignment is assessed to determine if it is within the lithography machine's acceptable global alignment specifications (114). If not, the substrate S is remounted within the holder H and once again tested for acceptable global alignment (116).

Once global alignment has been confirmed (114), rough height measurement check and adjustment is performed (120). An external height measurement device (not shown) is used to measure the relative height of a substrate holder H calibration marker 60 positioned to serve as a reference for the lithography tool focal plane P (122). One skilled in the art will recognize that the measurement device can be any system used outside of the lithography system that measures height, including systems using laser beams, light emitting diodes or some other optical measurement means.

Next, the external height measurement device is used to measure and record the height of reflectors 30 patterned on the surface 40 of the substrate S (124). It should be appreciate that the measured height of reach reflector 30 is relative to the height of the calibration marker 60, since the height of every reflector 30 from the surface 40 of the substrate is the same. Then, the height of the reference calibration marker 60 is compared to the height of the reflectors 30 to determine if the difference is within an acceptable tolerance specific to the lithography tool. In this case using an E-Beam lithography system, an acceptable external rough adjustment tolerance is in the range of +/-15 micrometers. If not within the acceptable tolerance, spacer material 50 having appropriate thickness is placed under the substrate holder clamps 20 to obtain the correct height range required using the mapped-out heights of the reflectors 30 (128). This rough adjustment (120) is repeated until it has been determined that the height range differential is within an acceptable tolerance.

Once the rough adjustment (120) is completed, the finer height adjustment phase proceeds within the lithography system by mapping the height of the reflectors 30 (130) using the internal height detection system of the lithography tool. The adjusted substrate S and holder H including the spacers 50 for adjustment of height are loaded into the lithography system (132). The lithography system is then setup (134). The built-in lithography tool height measurement device is then used to measure the height of the holder calibration marker as a reference (136). The lithography tool height measurement device is then used to pre-map the height of the reflectors 30 distributed on the surface 40 of the substrate S and to measure and record the measured heights of the reflectors 30 (138).

In a first embodiment, a stepper focal system may be used to determine the location of the substrate wafer surface plane. The stepper uses a series of LED lights that are reflected off the surface of the wafer substrate S. A receiver detects the reflected to determine the position of the surface 40 of the wafer substrate S in the z-direction. Since the LED lights are discrete and their light beams will impinge on specific areas of the wafer substrate S, the determination of the wafer surface plane is sensitive to the wafer topology. In this method, there is no conflict with the patterning reflectors 30 since the size of each reflector 30 is large in comparison to the optical beam, and, the specific size is not critical The fine adjustment of the position of the substrate S in the holder H is then repeated until the surface 40 of the substrate S is determined to be within an acceptable differential height range (140) equivalent to the acceptable focal range R off the focal plane P of the particular lithography tool. The results of the difference in the height measurements of the holder calibration reference marker 60 and the reflectors 30 is determined (142). In the case for E-beam lithography, if the differential is greater than +/-25 micrometers, or, within +/-25 micrometers but still unacceptable, the substrate S and holder IS is removed from the lithography system (142). If the differential is greater than +/-25 micrometers, the substrate S is returned (144) for external rough readjustment (120) and repeat of subsequent steps. If the differential is within +/-25 micrometers, but not within an acceptable range, such as +/-15 micrometers, the spacer material is adjusted accordingly (146). If the heights were too high, a spacer 50 having the proper thickness is placed under the wafer substrate clamps 20 and the substrate S and holder H are reloaded into the lithography tool to repeat the fine adjustment (130). Likewise, if the heights were too low, a spacer 50 is removed from under the substrate holder clamp 20 and replaced with a thinner spacer 50 and the substrate S and holder H are reloaded into the lithography tool to repeat the fine adjustment (130). Although in this preferred embodiment an acceptable range is stated as within +/-25 micrometers, the acceptable range used may be smaller or larger to accommodate other lithography systems.

Once the wafer substrate S is determined to be properly positioned in the substrate holder H to cause the surface 40 of the substrate S to be within an acceptable focal range R of the focal plane P, the exposure process is begun (150). It should be appreciated that the exposure process proceeds without requiring the removal of the reflectors 30, thereby simplifying the overall production process. As shown in FIG. 1, the reflectors 30 are small and distributed on the surface 40 of the substrate S such that substantial portions of the substrate surface 40 may be processed with the reflectors 30 in place.

If, after repeating the various adjustment procedures described above, it is determined that the variation of the wafer topography is sufficiently extreme that it cannot be positioned to meet the focal range R specifications of the particular lithography tool, the wafer may be discarded, resurfaced or recycled and exposure does not proceed (160).

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is not specifically disclosed herein.

We claim:

1. An apparatus for adjusting placement of a substrate in a lithography system to place the substrate in a desired focal range of the lithography system, comprising:
    a height detection device,
    a substrate holder for receiving the substrate;
    at least one holder clamp for retaining the substrate in said substrate holder;
    at least one reflector patterned on a surface of the substrate for determining a height of said substrate surface wherein a height of said at least one reflector from said surface of the substrate is known;
    a calibration marker on said substrate holder to serve as a height reference;
    at least one spacer for placement under said at least one holder clamp to place said substrate surface in said acceptable focal plane range of said lithography system;
    wherein said known height of said at least one reflector is compared to a height of said calibration marker using said height detection device to determine if said substrate surface is within said acceptable focal range of said lithography tool and adjusting a position and a placement of said substrate within said substrate holder using said at least one spacer to place said substrate surface within said acceptable focal range.

2. The apparatus of claim 1 wherein the substrate is transparent.

3. The apparatus of claim 1 wherein said surface of the substrate is non-flat.

4. The apparatus of claim 1 wherein the substrate is made of material selected from the list of gallium nitride, gallium arsenide, silicon carbide, sapphire, silicon, indium phosphide, quartz, silicon oxide, glass, and plastic.

5. The apparatus of claim 1 wherein said reflector is made of material selected from the list of gold, silver, nickel, platinum, aluminum, copper, titanium, tungsten, nichrome, molybdenum, palladium, steel, brass, other metals and alloys and combinations thereof.

6. The apparatus of claim 1 wherein said reflector thickness ranges between 500 Angstroms and 5000 Angstroms.

7. The apparatus of claim 1 wherein said spacer thickness ranges from 1 micrometer to 50 micrometers.

8. The apparatus of claim 1 wherein said reflectors have diameters from 5 micrometers to 3 millimeters.

9. The apparatus of claim 1 wherein said lithography system is selected from the group of optical and E-Beam lithography systems.

10. The apparatus of claim 1 wherein said lithography system is an E-Beam lithography system.

11. The apparatus of claim 1 wherein said calibration marker is present on said surface of the substrate.

* * * * *